(12) United States Patent
Ahamed et al.

(10) Patent No.: US 10,522,381 B2
(45) Date of Patent: Dec. 31, 2019

(54) ALIGNER APPARATUS AND METHODS

(71) Applicant: Applied Materials, Inc., Santa Clara, CA (US)

(72) Inventors: Yaseer Arafath Ahamed, Austin, TX (US); James D. Strassner, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 264 days.

(21) Appl. No.: 15/481,679

(22) Filed: Apr. 7, 2017

(65) Prior Publication Data

US 2018/0294175 A1 Oct. 11, 2018

(51) Int. Cl.
  *B25B 5/14* (2006.01)
  *H01L 21/68* (2006.01)
  *H01L 21/687* (2006.01)

(52) U.S. Cl.
  CPC ............ *H01L 21/682* (2013.01); *H01L 21/68* (2013.01); *H01L 21/68707* (2013.01); *H01L 21/68728* (2013.01)

(58) Field of Classification Search
  USPC ..... 269/86, 115, 118; 414/217, 225.01, 806, 414/939
  See application file for complete search history.

(56) References Cited

U.S. PATENT DOCUMENTS

| | | | |
|---|---|---|---|
| 6,318,957 B1 | 11/2001 | Carr et al. | |
| 7,039,501 B2 | 5/2006 | Freeman et al. | |
| 2003/0053904 A1* | 3/2003 | Kirihata | H01L 21/68 414/783 |
| 2004/0191028 A1* | 9/2004 | Tamai | H01L 21/67069 414/217 |
| 2005/0110974 A1* | 5/2005 | Hashimoto | G03B 27/58 355/72 |
| 2008/0138178 A1* | 6/2008 | Ferrara | H01L 21/67201 414/217.1 |
| 2014/0147234 A1* | 5/2014 | Moura | H01L 21/67748 414/222.01 |
| 2015/0219486 A1 | 8/2015 | Fenske et al. | |

FOREIGN PATENT DOCUMENTS

KR 100751496 B1 8/2007

OTHER PUBLICATIONS

PCT International Search Report and Written Opinion in PCT/US2018/025001 dated Jul. 17, 2018, 11 pages.

* cited by examiner

*Primary Examiner* — Joseph J Hail
*Assistant Examiner* — Shantese L McDonald
(74) *Attorney, Agent, or Firm* — Servilla Whitney LLC (57) ABSTRACT

Described herein are aligners and methods of aligning workpieces. A workpiece aligner apparatus comprises an aligner chuck including an arm having a first end and a second end, a first edge gripping element on the first end and a second edge gripping element on the second end, the first edge gripping element and the second edge gripping element spaced apart to hold a workpiece at edges thereof, and a central workpiece handling element located in a central region of the arm, wherein the central workpiece handling element has a height such that the central workpiece handling element extends higher than the first edge gripping element and second edge gripping element.

19 Claims, 12 Drawing Sheets

ALIGNER APPARATUS AND METHODS

TECHNICAL FIELD

Embodiments of the present disclosure relate generally to processing and aligning workpieces such substrates and carriers and, more specifically, to an apparatus and a method for processing workpieces utilizing an aligner.

BACKGROUND

Workpiece handlers are commonly used in semiconductor manufacturing to transfer workpieces such as substrates (e.g., semiconductor wafers) through the various processes of manufacturing. Semiconductor processing equipment utilizes workpiece or substrate aligners to provide alignment functions and substrate identification functions during semiconductor processing. These workpiece or substrate aligners are generally mounted at one end (e.g. on a side) of a factory interface or equipment front end module. Manufacturers use aligners to "center find" and "position" substrates or carriers in a specific orientation to ensure process performance/uniformity is properly tracked.

Figure 1:
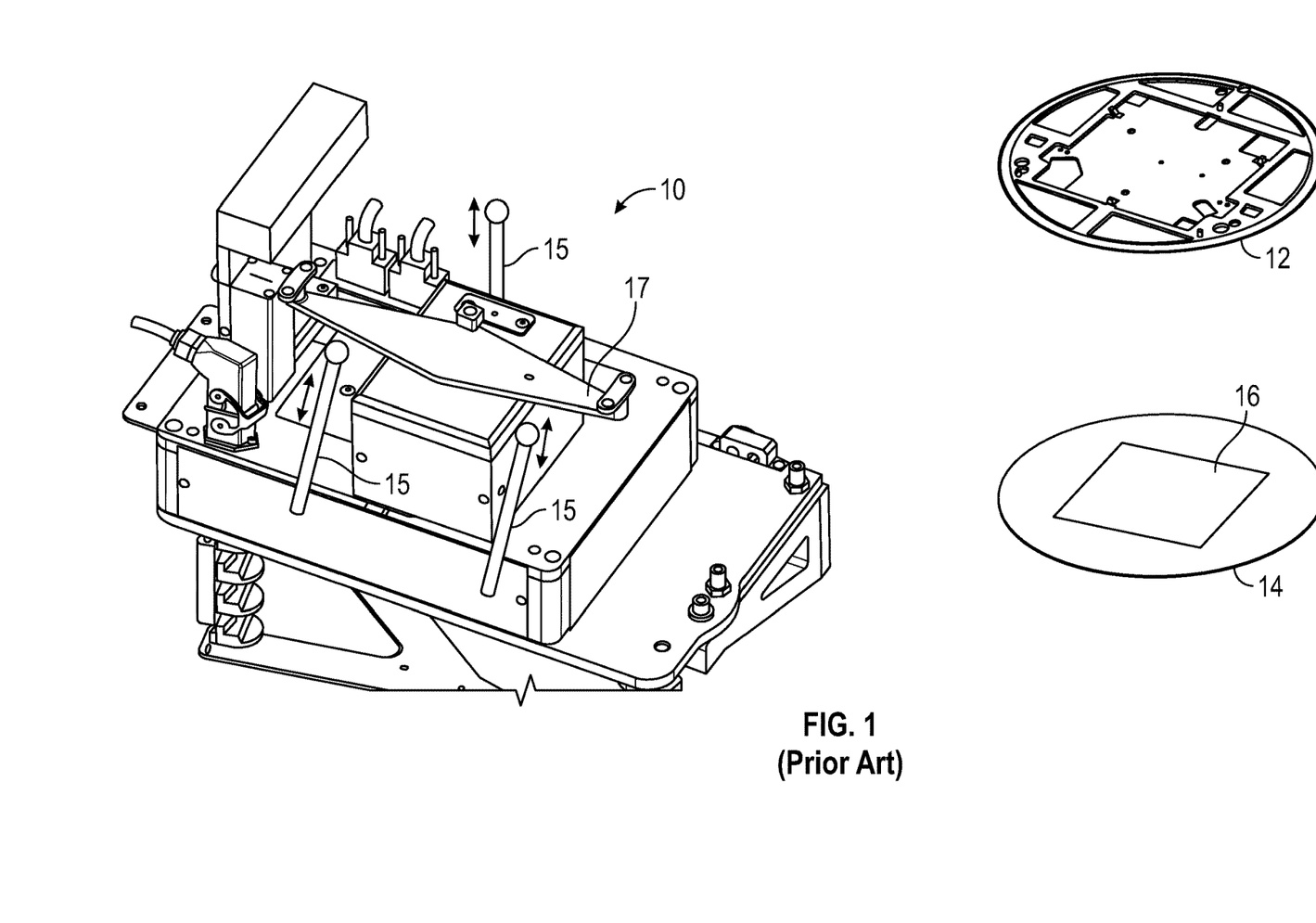
FIG. 1 is a perspective view of an outer/edge contact aligner.
Figure 2:
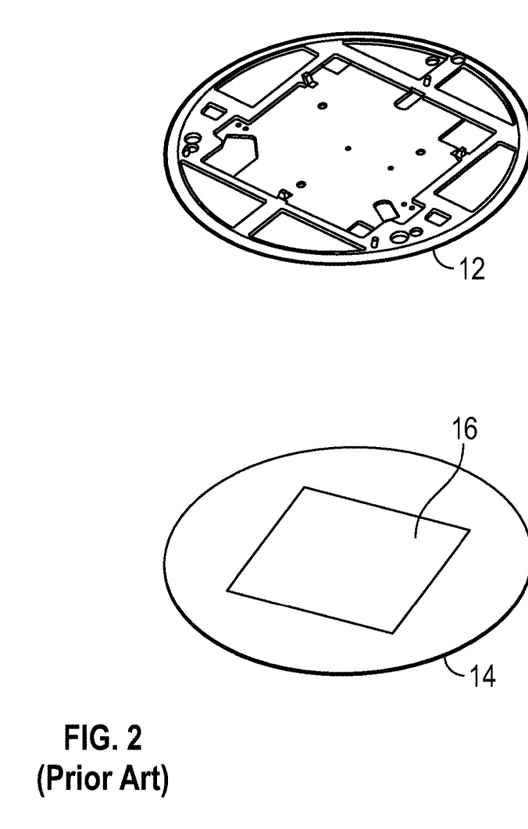
FIG. 2 is a perspective view of a center contact aligner.

Currently, aligners are either "center contact" or "edge/outer contact" type. Center contact aligners will work with any solid substrate or work piece such as wafers or carrier bases which may hold other substrates such as reticles. However, a center contact aligner will not work with a work piece that has a large opening or hole in the middle such as a. carrier shield. An edge/outer contact aligner is required to support the work pieces with a large hole in the center. FIG. 1 shows an edge/outer contact aligner 10 which can support either solid workpiece in the form of solid carrier base 12 or a shield 14 with an opening 16 therein. FIG. 2 shows a center contact aligner 20, which can process a solid carrier base 12 or wafer, but not the shield 14 having the large opening 16 therein because the center contact aligner 20 does not have a chuck 22 large enough to accommodate the opening 16 in the shield 14.

A problem with current edge/outer contact aligners is that they require an additional internal mechanism such as the lift pins 15 shown in FIG. 1 to lift the wafer or carrier off the aligner arm 17 so that it can be removed. This additional internal lifting mechanism creates particles and adds complexity and cost to the aligner design. It would be useful to provide an aligner that can align without an internal lifting mechanism and that is capable center contact alignment or edge/outer contact alignment utilizing a single aligner head design.

SUMMARY

A first embodiment provides a workpiece aligner apparatus comprising an aligner chuck including an arm having a first end and a second end extending in an X-Y plane; a first edge gripping element on the first end and a second edge gripping element on the second end, the first edge gripping element and the second edge gripping element spaced apart to hold a workpiece at edges thereof; and a central workpiece handling element located in a central region of the arm, wherein the central workpiece handling element has a height in a Z-direction such that the central workpiece handling element extends higher than the first edge gripping element and second edge gripping element in the Z-direction.

A second embodiment provides a workpiece aligner apparatus comprising an aligner chuck including an arm having a first end and a second end opposite the first end; a first edge gripping element on the first end and a second edge gripping element on the second end, the first edge gripping element and the second edge gripping element spaced apart to hold a workpiece at edges thereof; and a controller which controls rotation of the arm between a dead zone in which a robot blade is prevented from loading the workpiece to be held by the first edge gripping element and the second edge gripping element when the arm is in a first position and a transfer zone in which the robot blade permits loading of the workpiece to be held by the first edge gripping element and the second edge gripping element when the arm is in a second position.

An exemplary method embodiment provides a method of processing a workpiece in an aligner apparatus, the method comprising: moving a workpiece on a robot blade and moving the robot blade toward an aligner chuck including an arm having a first end and a second end opposite the first end, a first edge gripping element on the first end and a second edge gripping element on the second end, the first edge gripping element and the second edge gripping element spaced apart to hold the workpiece at edges thereof, the arm moveable from a first radial position which permits loading of the workpiece on the aligner chuck and a second radial position which does not permit loading of the workpiece on the aligner chuck; checking if the arm is in the first radial position or the second radial position; and loading the workpiece on the aligner chuck when the arm is in the first radial position.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate embodiments of this disclosure and are therefore not to be considered limiting of its scope, for the disclosure may admit to other equally effective embodiments.

DETAILED DESCRIPTION

Various embodiments in accordance with the present disclosure will now be described more fully hereinafter with reference to the accompanying drawings. The workpiece aligner apparatus and methods described herein may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a device as appearing in the figures. The terminology will include the words specifically mentioned, derivatives thereof, and words of similar meaning and/or significance.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

In view of the foregoing, an advantage of one or more embodiments of the present disclosure is that a problem with current edge/outer contact aligners is solved by eliminating an additional internal workpiece lifting mechanism such as the lift pins 15 shown in FIG. 1 to lift the workpiece such as a wafer or carrier off the aligner arm 17 so that it can be removed. In one or more embodiments, elimination of this additional internal workpiece lifting mechanism reduces particles. Furthermore, the additional workpiece lifting mechanism adds complexity and cost to the aligner apparatus. Thus, in one or more embodiments, an aligner apparatus that does not require or include an internal lifting mechanism provides a simplified aligner apparatus design and reduced generation of particles during aligning of workpieces such as substrates and carriers. In addition, one or more embodiments simplifies alignment processes of diverse workpieces by providing an aligner apparatus having a chuck that that is capable either center contact alignment or edge/outer contact alignment utilizing a single aligner head design.

Providing an aligner apparatus that reduced particle generation is very beneficial in the manufacture of elements for extreme ultraviolet lithography (EUV), also known as soft x-ray projection lithography. EUV has begun to replace deep ultraviolet lithography for the manufacture of 0.13 micron, and smaller, minimum feature size semiconductor devices. EUV systems operate by reflection instead of transmission of light. Through the use of a series of mirrors, or lens elements, and a reflective element, or mask blank, coated with a non-reflective absorber mask pattern, patterned actinic light is reflected onto a resist-coated semiconductor wafer.

Conventional EUV blank processes may include, for example, a 152 mm×152 mm blank reticle being placed into a coating tool to apply various coatings. As configured, the square reticle is sandwiched within a carrier assembly (e.g., a 300 mm carrier assembly) to enable the reticle to be transferred through the coating tool like a 300 mm wafer. The carrier assembly may include a carrier base, the reticle blank, and a carrier shield. During manufacture of a reticle, the carrier assembly may be aligned during the manufacturing process.

Figure 3:
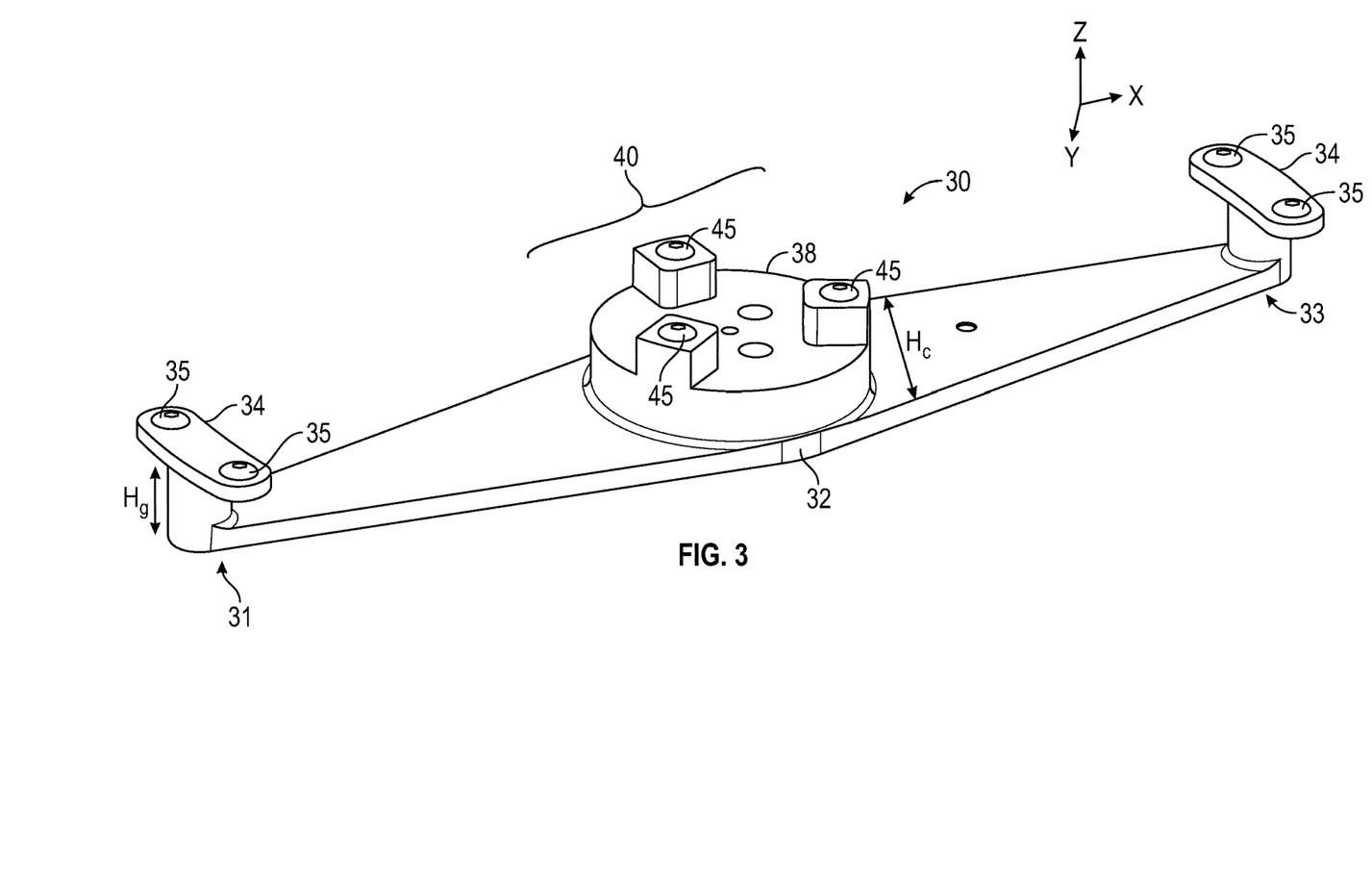
FIG. 3 is a perspective view of an aligner head or chuck in accordance with an embodiment of the disclosure.

Referring now to FIG. 3, a component of a workpiece aligner apparatus is shown. An aligner chuck 30 including an arm 32 having a first end 31 and a second end 33 extending in an X-Y plane. As used herein, "workpiece" refers to a substrate such as a semiconductor wafer, a solid carrier or shield to hold a substrate such as an EUV reticle or a carrier or shield with an opening therein to hold a substrates such as an EUV reticle. A first edge gripping element 34 is on the first end 31 and a second edge gripping element 36 is on the second end 33. The first edge gripping element 34 and the second edge gripping element 36 can be mounted on the arm 32 in any suitable way, such as by using fasteners 35 as shown. The fasteners 35 can be screws, bolts, threads, rivets or any other suitable fastening device. The first edge gripping element 34 and the second edge gripping element 36 are spaced apart to hold a workpiece at edges thereof. Exemplary workpieces include semiconductor substrates, or carriers/carrier bases or shields such as the solid carrier base 12 or the shield 14 with an opening 16 therein shown in FIGS. 1 and 2. In specific embodiments, when the workpiece is a 300 mm diameter semiconductor substrate, or a 300 mm diameter solid carrier base 12 or 300 mm diameter shield 14, the first edge gripping element 34 and the second edge gripping element 36 are spaced apart by 300 mm to hold the semiconductor substrate, the solid carrier base 12 or shield 14 by the edges during an alignment process. Of course, for smaller diameter workpieces (smaller than 300 mm diameter), the distance between the first edge gripping element 34 and the second edge gripping element 36 would be decreased to be approximately equal to the diameter of the workpiece, and the distance would be increased for larger diameter workpieces (larger than 300 mm diameter). The disclosure is not limited to a particular spacing of the edge gripping elements.

The aligner chuck 30 further comprises a central workpiece handling element 38 located in a central region 40 of the arm 32. In specific embodiments, the central workpiece handling element 38 is centered on the arm 32. In the embodiment shown, the central workpiece handling element 38 is fastened to the arm with fasteners 45. In the embodiment shown, the central workpiece handling element 38 has a height (Hc) in a Z-direction such that the central workpiece handling element 38 extends higher in the Z-direction than the first edge gripping element and second edge gripping element in the Z-direction, which extend a distance Hg.

The aligner chuck 30 shown in FIG. 3 can be mounted to any standard rotary aligner that does not include an internal lift mechanism. The aligner chuck can be either passive (friction only) or active (vacuum). The two contact surfaces (first edge gripping element 34 and second edge gripping element 36) and central workpiece handling element 38 are at different Z heights which help to prevent particle cross contamination between the two surfaces.

Figure 4:
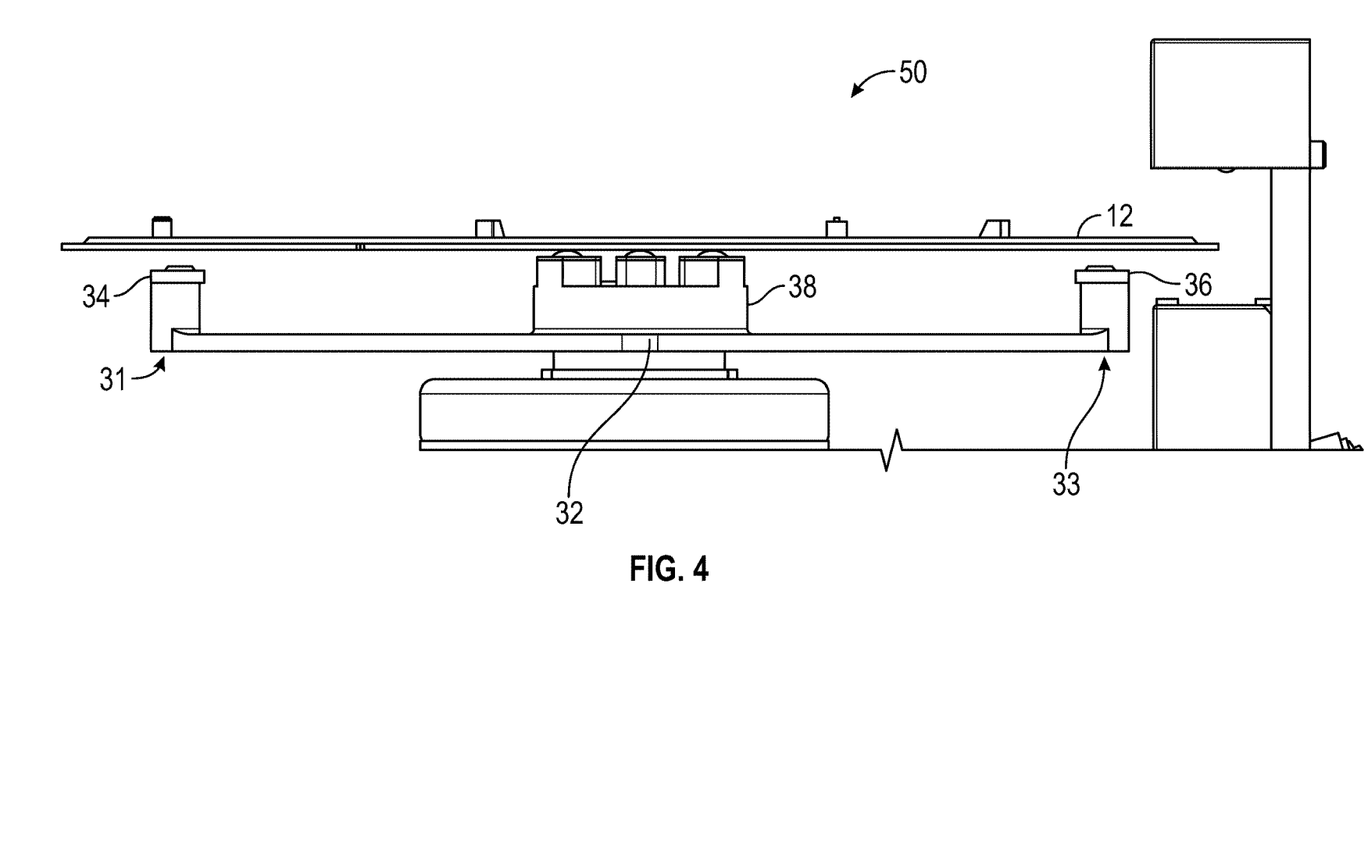
FIG. 4 is side view of an aligner with a carrier base supported thereon in accordance with an embodiment of the disclosure.

FIG. 4 shows a workpiece aligner apparatus 50 including the aligner chuck 30 shown in FIG. 3 with a solid carrier base 12 being held in place on the central workpiece handling element 38. As is seen in FIG. 4, the carrier base 12 does not contact the first edge gripping element 34 and second edge gripping element 36. The workpiece aligner apparatus 50 does not include a separate workpiece lifting mechanism such as lift pins to lift the workpiece off of the arm.

The first edge gripping element 34 and the second edge gripping element 36 are configured to hold either a flat solid workpiece or a flat workpiece having a central opening therein. When the central workpiece handling element holds a flat solid workpiece, the flat solid workpiece does not contact the first edge gripping element 34 and the second edge gripping element 36.

Figure 5:
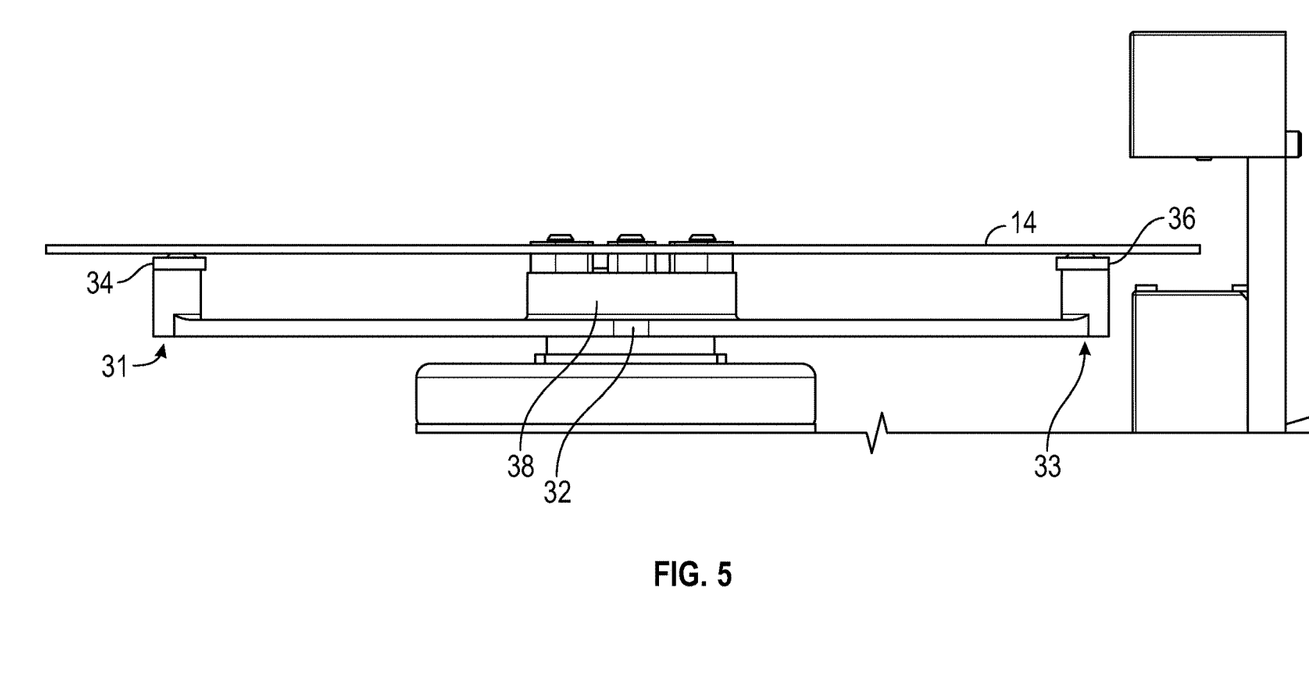
FIG. 5 is a side view of an aligner apparatus with a carrier shield having an opening supported thereon in accordance with an embodiment of the disclosure.
Figure 6:
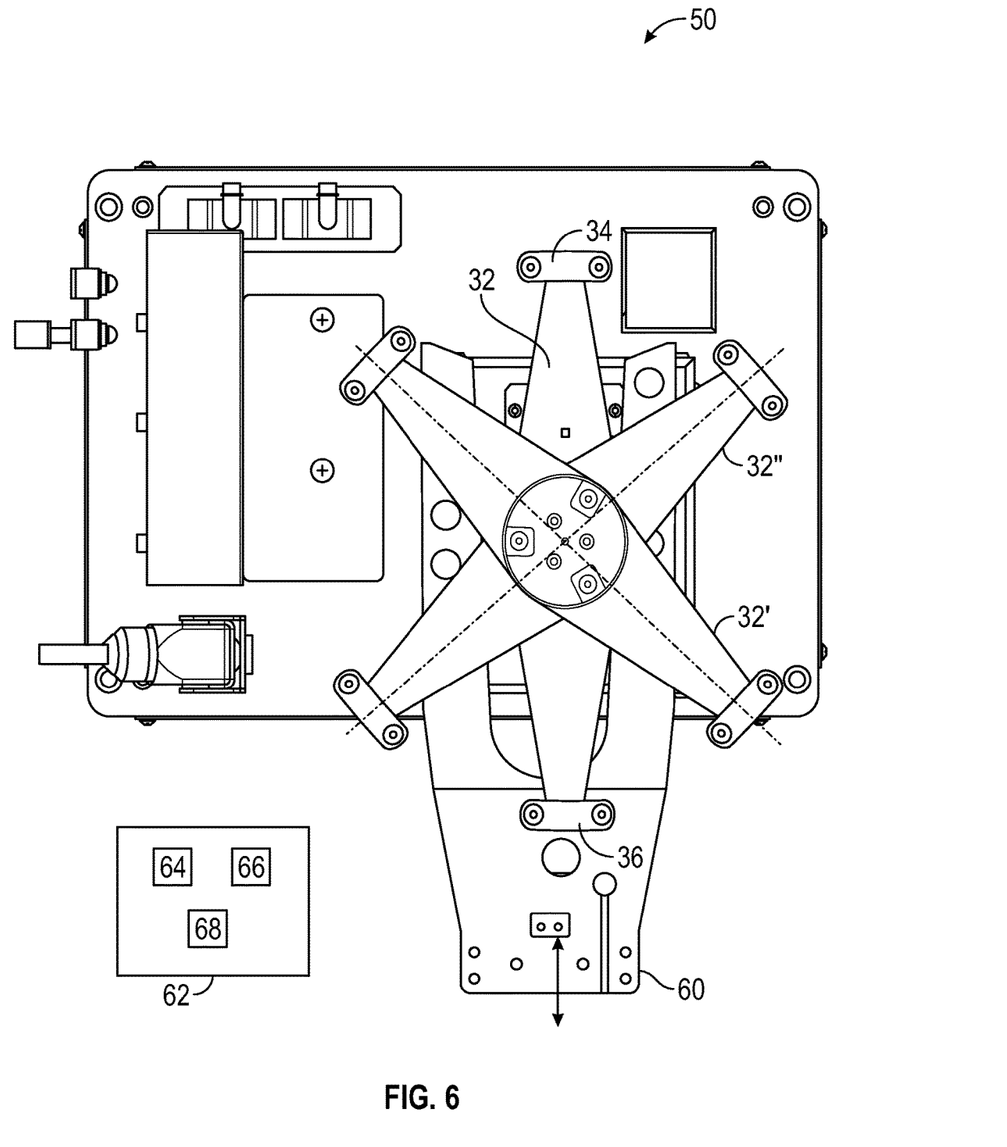
FIG. 6 is a top view of an aligner apparatus with the aligner in a position where a robot blade cannot load a substrate or carrier in accordance with an embodiment of the disclosure.

FIG. 5 shows the workpiece aligner apparatus 50 including the aligner chuck 30 shown in FIG. 3 with a flat shield 14 having a central opening therein 16, which can be in the form of a carrier shield. As seen in FIG. 6, the central opening causes the shield 14 in to be held by the first edge gripping element 34 and second edge gripping element 36. Thus, the central workpiece handling element 38 is configured to hold a flat solid workpiece but not configured to hold a flat workpiece having a central opening therein.

Figure 7:
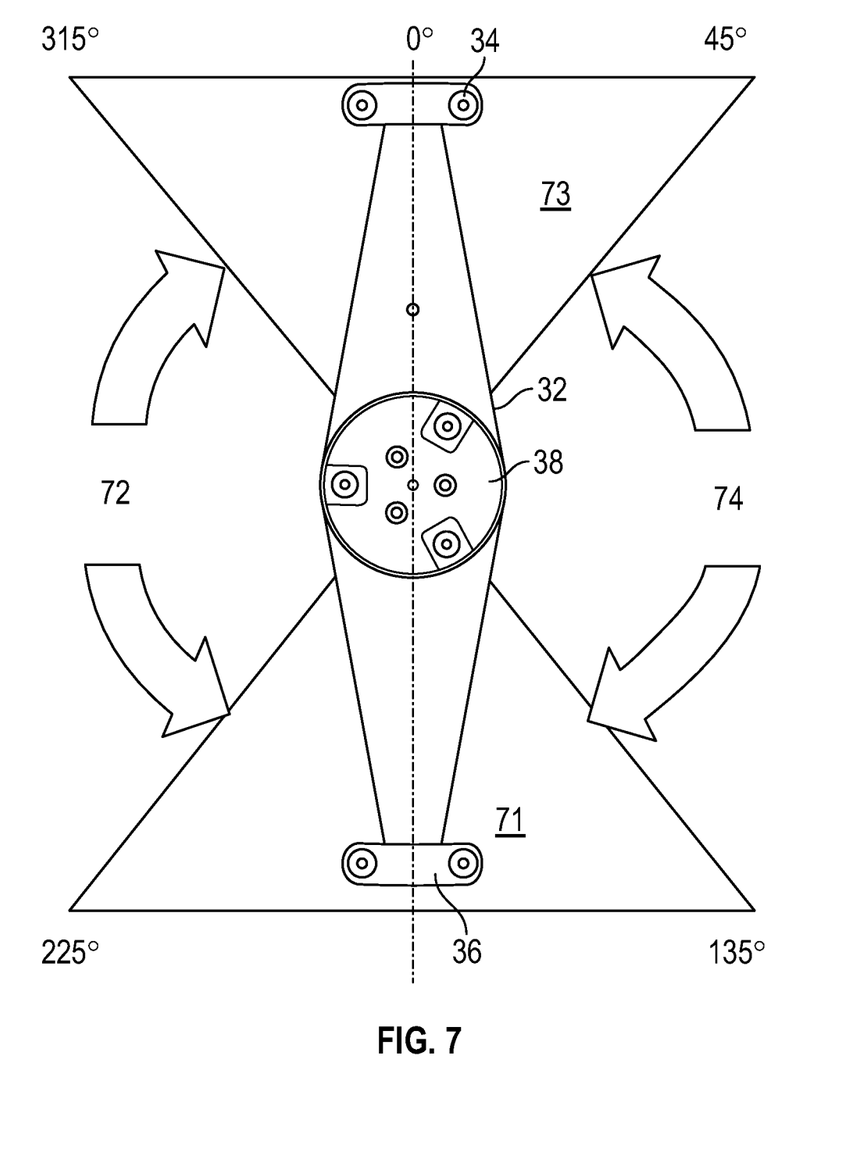
FIG. 7 is a top view of an aligner apparatus with the arm in a position where a robot blade can load a substrate or carrier in accordance with an embodiment of the disclosure.

FIG. 6 and FIG. 7 show a workpiece aligner apparatus 50 with a robot blade 60 configured to load a workpiece (not shown) onto the workpiece aligner apparatus 50. A controller 62, including a central processing unit (CPU) 64, a memory 66 and support circuits 68, is coupled to the workpiece aligner apparatus 50 to facilitate control loading of a workpiece, unloading of a workpiece and alignment of a workpiece placed on the workpiece aligner apparatus 50. The memory 66 can be any computer-readable medium, such as random access memory (RAM), read only memory (ROM), floppy disk, hard disk, or any other form of digital storage, local or remote to the workpiece aligner apparatus 50 or CPU 64. The support circuits 68 are coupled to the CPU 64 for supporting the CPU 64 in a conventional manner. These circuits can include cache, power supplies, clock circuits, input/output circuitry and subsystem, and the like. A software routine or a series of program instructions stored in the memory 66, when executed by the CPU 64, causes the workpiece to be loaded onto the workpiece aligner apparatus 50 by the robot blade 60, and the aligner apparatus to align the workpiece. Thus, the controller 62 controls rotation of the arm 32 and communicates with controller that controls movement of the robot blade 60 to load a workpiece. In some embodiments, rotation of the arm 32 and movement of the robot blade 60 may be controlled by a single controller 62.

With reference to FIGS. 6 and 7, which show a robot blade (FIG. 6) being moved towards the aligner to load a workpiece (not shown) using the first edge gripping element 34 and the second edge gripping element 36. In FIG. 6, the arm 32 is shown as 32' and 32", indicated by the dotted and dashed lines, which show a first rotational position or range of first rotational positions in which the robot blade 60 can load the workpiece to be held by the first edge gripping element 34 and the second edge gripping element 36. FIG. 7 shows a range of rotational positions depicted by arrows 72 and 74 that provide rotational positions where the robot blade 60 can load the workpiece without interference from the first edge gripping element 34 or the second edge gripping element 36. Zones 71 and 73 are indicated in FIG. 7 as zones in which the robot blade 60 contact either the first edge gripping element 34 and second edge gripping element, and thus the first edge gripping element 34 or the second edge gripping element 36 would interfere with the robot blade 60 and prevent loading of the workpiece. As an example only, the arm 32 cannot be in the 135 degree to 225 degree position from the home position of zero degree when a substrate is loaded onto the first edge gripping element 34 and the second edge gripping element 36 because the robot blade would be stopped or interfered with by the first edge gripping element 34 or the second edge gripping element. However, when the arm 32 is between 225 degrees and 315 degrees (or 45 degrees and 135 degrees) the robot blade is in the first position, permitting the robot blade to load a workpiece without interference. Note that the positions provided in this exemplary embodiment are not limiting, and other positions may be selected to define zone 71 and zone 73.

Thus, the controller 62 is configured to prevent the robot blade 60 from loading workpiece when the first edge gripping element 34 and the second edge gripping element 36 are in a second position which would interfere with the robot blade. The memory stores the first position and the second position. Stated another way, the controller 62 controls rotation of the arm 32 between a dead zone in which a robot blade 60 is prevented from loading the workpiece to be held by the first edge gripping element 34 and the second edge gripping element 36 when the arm is in a first position and a transfer zone in which the robot blade 60 is permitted to load the workpiece to be held by the first edge gripping element 34 and the second edge gripping element 36 when the arm is in a second position. The first position includes a first range of radial positions in which the robot blade does not interfere with the first edge gripping element or the second edge gripping element. The second position includes a second range of radial positions in which the robot blade interferes with the first edge gripping element or the second edge gripping element.

Figure 8:
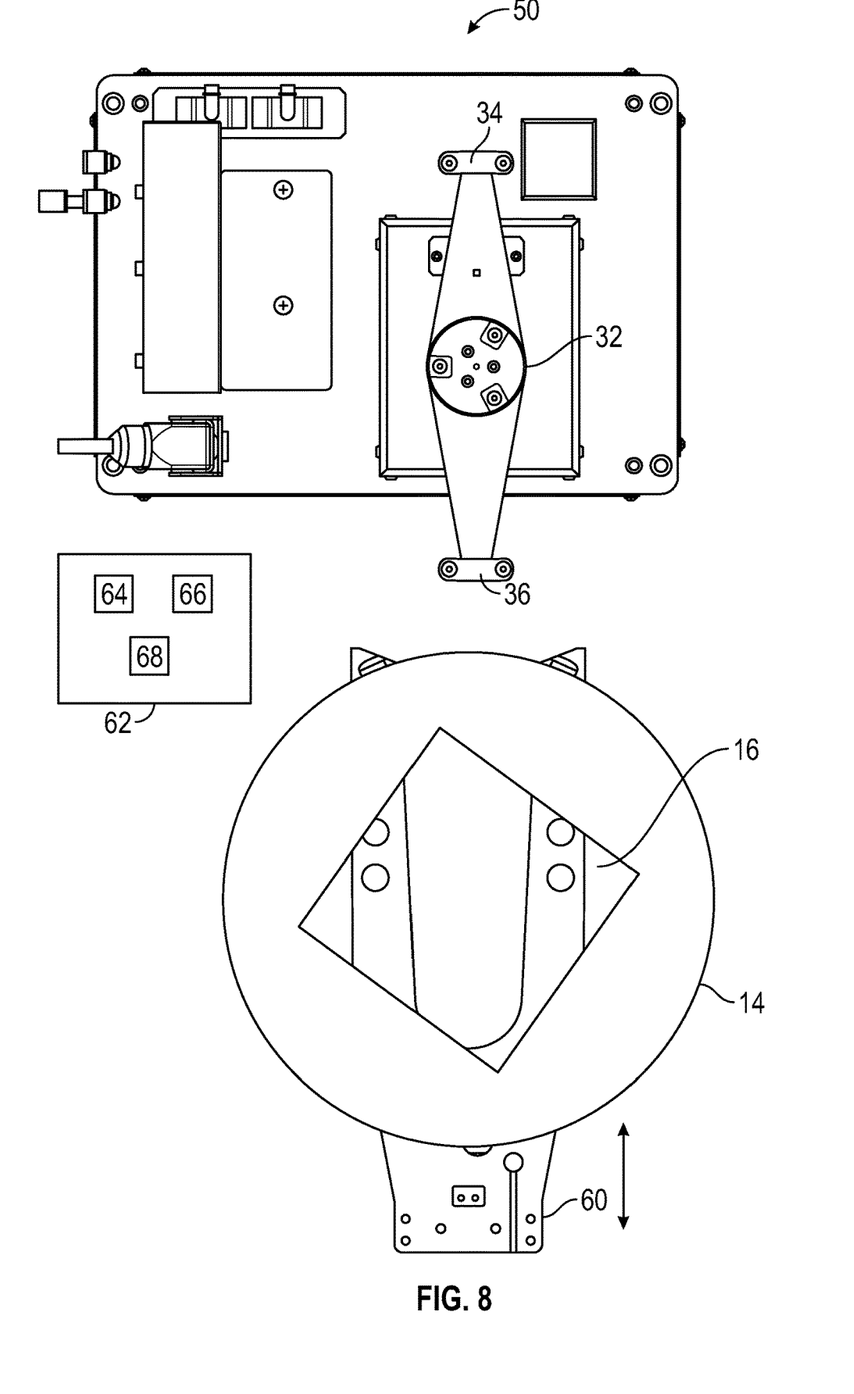
FIG. 8 is a top view of an aligner apparatus with the arm in a position where a robot blade cannot load a carrier with an opening in accordance with an embodiment of the disclosure.
Figure 9:
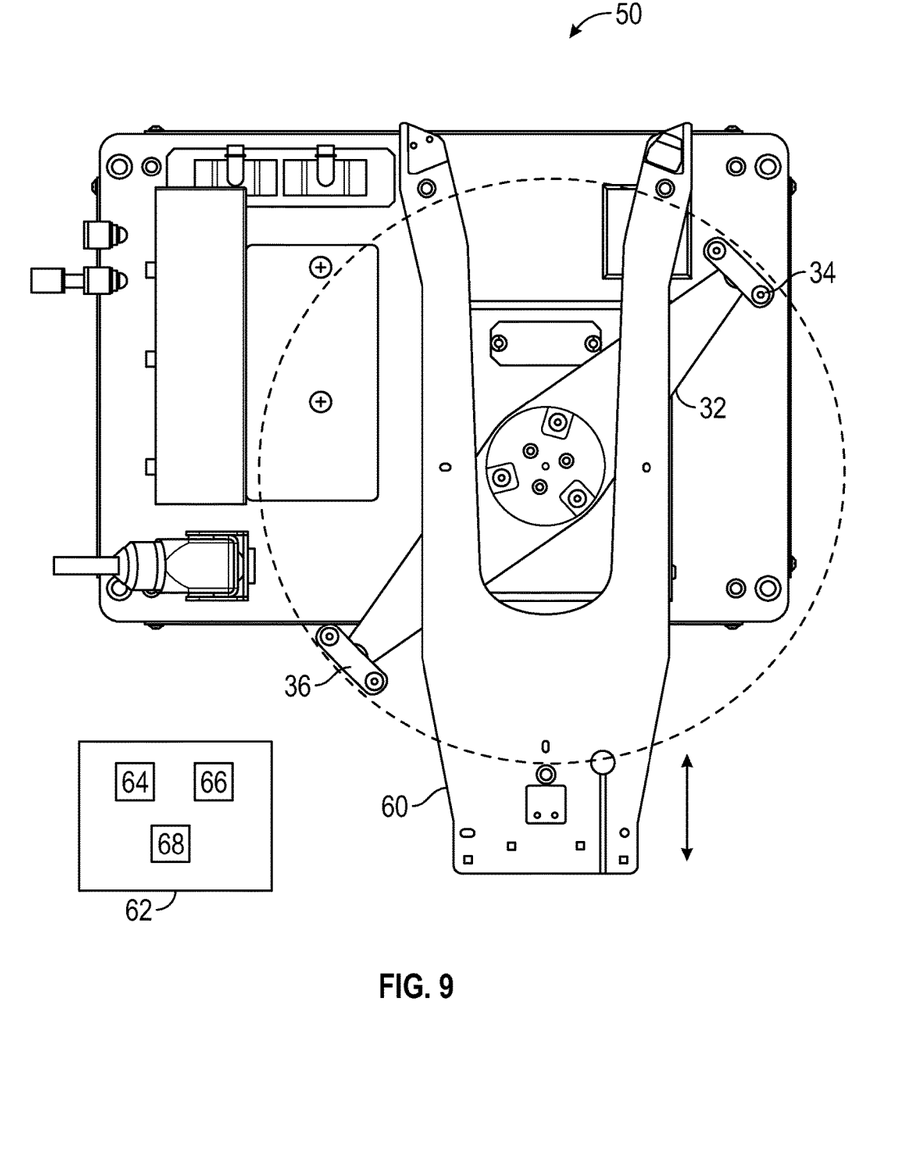
FIG. 9 is a top view of an aligner apparatus with the arm in a position where the robot blade can load a carrier with an opening after alignment and center correction in accordance an embodiment of the disclosure.
Figure 10:
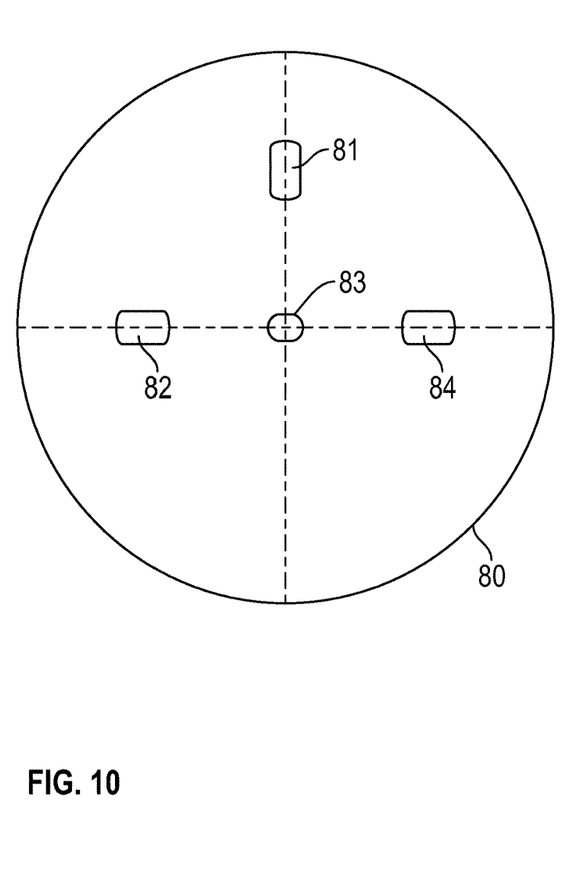
FIG. 10 is a top view of an aligner apparatus and a calibration substrate in accordance an embodiment of the disclosure.

FIG. 8 shows the robot blade 60 holding a flat shield 14 having a central opening therein 16 with the arm 32 in the second position where loading is prevented by interference with the robot blade. FIG. 9 shows the robot blade 60 in the first position where the robot blade 60 can load a workpiece with an opening after alignment and center correction of the workpiece aligner apparatus 50. FIG. 10 shows a workpiece aligner apparatus 50 with the robot blade 60 and the arm 32 in a position to load a workpiece. A dummy workpiece 80 is shown with workpiece alignment markings 81, 83 and blade alignment markings 82, 84, which can be used to align the robot blade 60 to the dummy workpiece 80.

Figure 11:
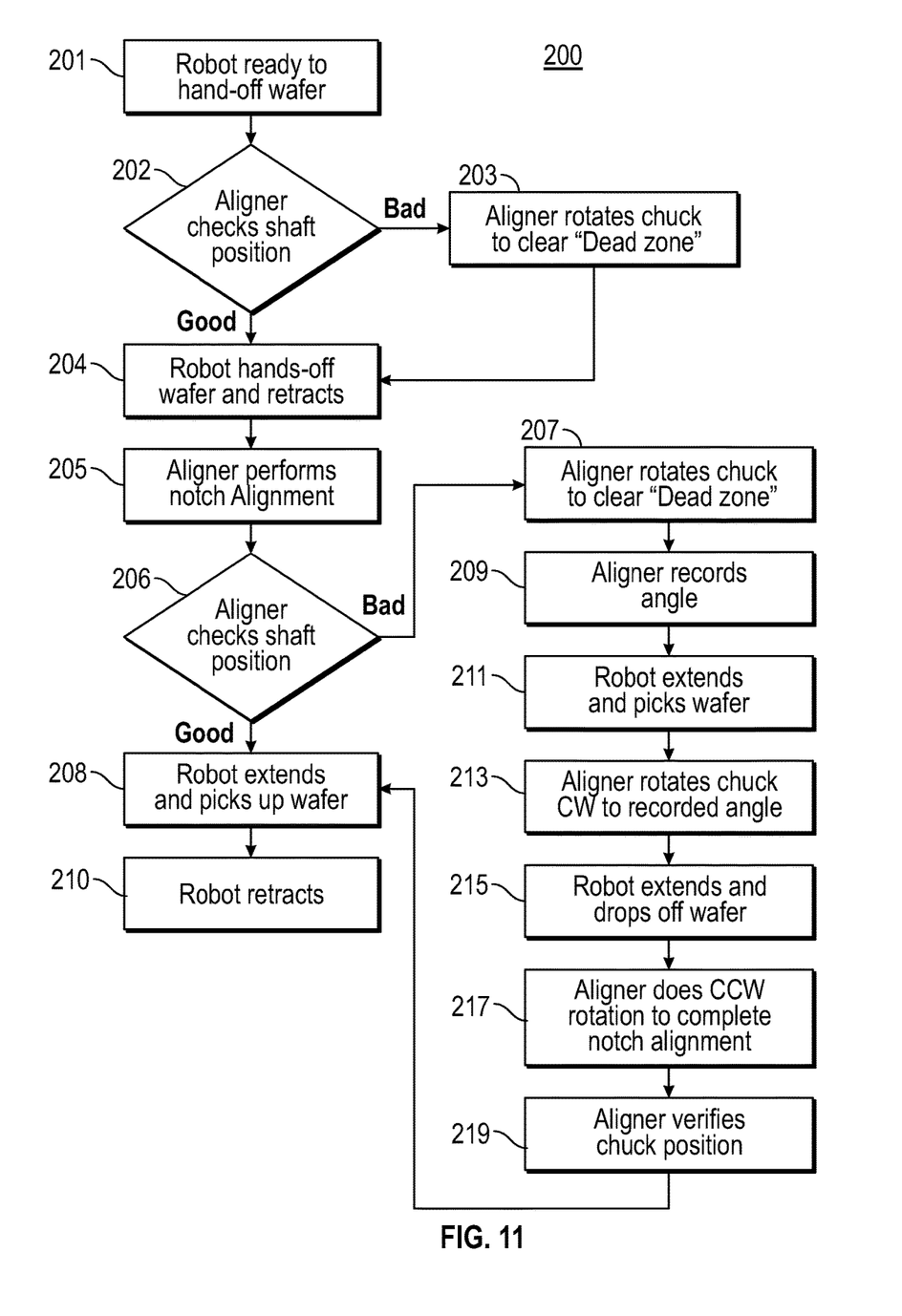
FIG. 11 is a flowchart illustrating an exemplary method for operating an aligner apparatus according to an embodiment of the disclosure.

FIG. 11 depicts flow diagrams of exemplary embodiments of methods for aligning a workpiece in accordance with certain aspects of the present disclosure. In some embodiments, the methods may be implemented or instructed in part using a computer system. As such, the methods may provide the functionality and/or operation of possible implementations of systems, methods, and computer program products according to various embodiments of the present disclosure. In this regard, the blocks in the flowchart may represent a module, segment, or portion of code, comprising one or more executable instructions for implementing the specified logical function(s). As also noted, in some alternative implementations, the functions noted in the blocks might occur out of the order depicted in the figures. For example, two blocks shown in succession may, in fact, be executed concurrently. As also noted, the block of the method 200 can be implemented by special purpose hardware-based systems for performing the specified functions or acts, or combinations of special purpose hardware and computer instructions.

In FIG. 11, the method 200 may include placing a workpiece, for example, in the form of a substrate or a wafer or a carrier or shield on a robot blade where the robot connected to the robot blade is ready to hand off the wafer to a workpiece aligner apparatus as shown at block 201. The method may further include the workpiece aligner apparatus checking the shaft position that rotates the arm as shown at block 202. If the position is deemed to be "good," that is, as described earlier, where the arm is positioned in a radial position such that the first edge gripping element 34 and the second edge gripping element 36 will not interfere with the robot blade, the robot blade can place the workpiece (e.g., hands-off the wafer) onto the aligner apparatus and the robot blade retracts as shown in block 204. However, if the position of the arm is deemed to be "bad," the aligner apparatus controlled by the controller rotates the arm to clear the "dead zone" and to place the arm in a radial position where the blade and the first edge gripping element 34 and the second edge gripping element 36 will not interfere with each other as shown in block 207. The workpiece alignment apparatus records the rotational position or angle in a memory as shown in block 209, the robot blade extends to pick up the workpiece as shown in block 211, the controller sends a signal so that the aligner apparatus rotates the chuck clockwise to the recorded angle or position stored in the member as shown in block 213, the robot blade drops the workpiece onto the aligner apparatus as shown in block 215, the aligner apparatus rotates counterclockwise to complete notch alignment as shown in block 217, and the aligner apparatus verifies the rotational position of the chuck and arms as shown in block 219 before completing the process in blocks 208 and 210.

Thus, in an embodiment, a method of processing a workpiece in an aligner apparatus comprises moving a workpiece on a robot blade and moving the robot blade toward an aligner chuck including an arm having a first end and a second end opposite the first end, a first edge gripping element on the first end and a second edge gripping element on the second end, the first edge gripping element and the second edge gripping element spaced apart to hold the workpiece at edges thereof, the arm moveable from a first radial position which permits loading of the workpiece on the aligner chuck and a second radial position which does not permit loading of the workpiece on the aligner chuck; checking if the arm is in the first radial position or the second radial position; and loading the workpiece on the aligner chuck when the arm is in the first radial position.

In some embodiments, the method further comprises rotating the arm after loading the workpiece on the chuck to notch aligns the workpiece. In one or more embodiments, wherein when the arm is in the second radial position, the method further comprises preventing the robot blade from loading the workpiece on the aligner chuck. In some embodiments, the method further comprises rotating the arm until the arm is in the first radial position, and then loading the workpiece on the chuck when the arm is in the first radial position. The method further comprises aligning the workpiece. In one or more embodiments, the workpiece is an EUV reticle blank on a carrier.

The substrate aligner apparatus performs a notch alignment as shown in block 205. The controller then sends a signal and checks the shaft position to ensure the arm is in a radial position so that the wafer can be removed from the workpiece aligner apparatus as shown in block 206. If the arm is in the first position where the robot blade and the first edge gripping element 34 and second edge gripping element 36 will not interfere with the robot blade, the robot blade extends and picks up the wafer as shown in block 208 and the robot blade retracts as shown in block 210. However, after the notch alignment is performed in block 205, and the shaft/arm position is deemed "bad", the controller sends a signal so that the workpiece aligner apparatus rotates the chuck to clear the dead zone.

Another aspect pertains to a method of aligning a workpiece comprising moving a workpiece from a first location to an aligner having a first contact surface to contact the workpieces at the edge and a second contact surface to contact the workpiece at the center; rotating the workpiece aligner away from a dead zone wherein the robot blade cannot transfer the workpiece to the aligner; aligning the workpiece; rotating the workpiece away from the dead zone; and removing the substrate from the aligner.

Figure 12:
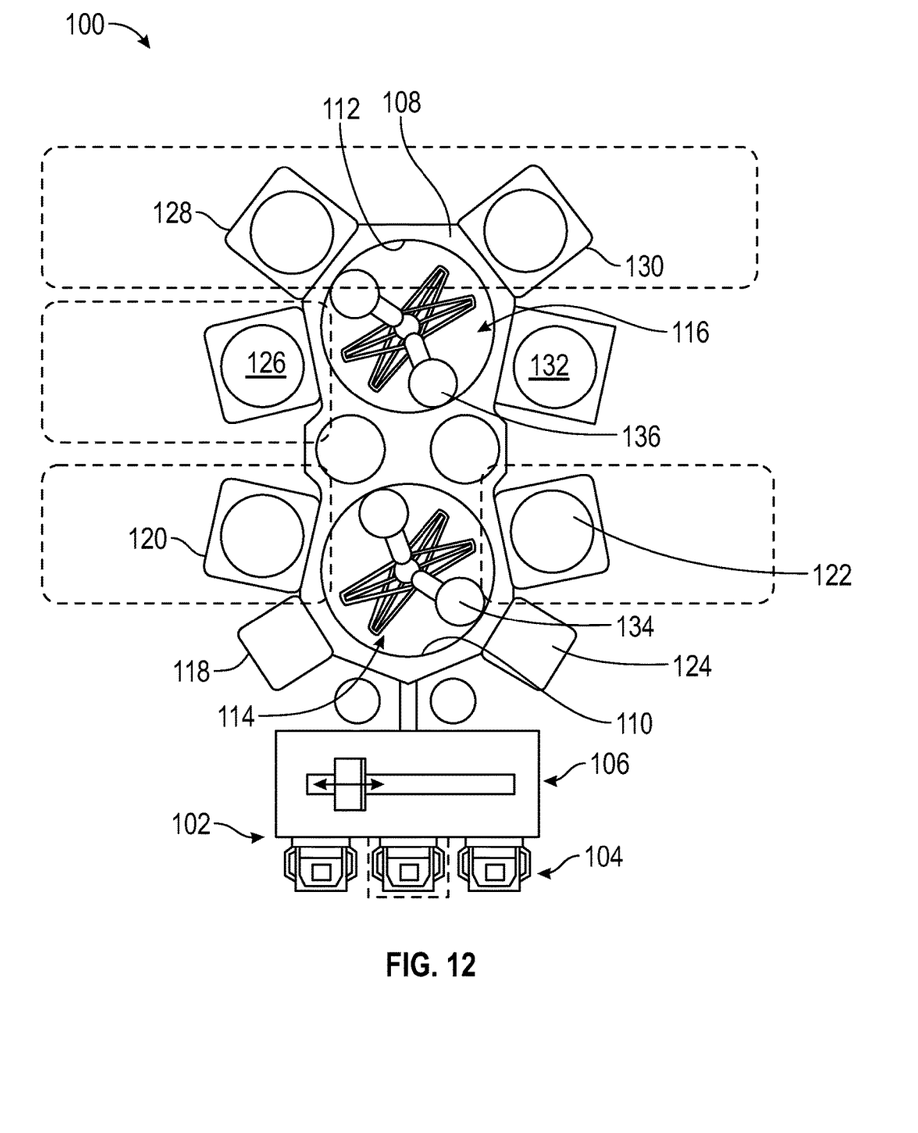
FIG. 12 shows a schematic of an exemplary coating tool in accordance with certain aspects of the present disclosure.

As mentioned above, the workpiece aligner apparatus and method are beneficial in the manufacture of EUV devices such as EUV masks. FIG. 12 depicts an EUV mask production system 100, which can be used with the workpiece aligner apparatus 50 described herein according to one or more embodiments. The EUV mask production system 100 may include a mask blank loading and carrier handling system 102 receiving one or more mask blanks 104. An airlock 106 provides access to a wafer handling vacuum chamber 108. In the embodiment shown, the wafer handling vacuum chamber 108 contains two vacuum chambers, e.g., a first vacuum chamber 110 and a second vacuum chamber 112. Within the first vacuum chamber 110 is a first wafer handling system 114, and in the second vacuum chamber 112 is a second wafer handling system 116.

The wafer handling vacuum chamber 108 may have a plurality of ports around its periphery for attachment of various other systems. In this non-limiting embodiment, the first vacuum chamber 110 has a degas system 118, a first physical vapor deposition system 120, a second physical vapor deposition system 122, and a pre-clean system 124. Furthermore, the second vacuum chamber 112 may include a first multi-cathode source 126, a flowable chemical vapor deposition (FCVD) system 128, a cure system 130, and a second multi-cathode source 132 connected to it.

The first wafer handling system 114 is capable of moving wafers, such as a wafer 134, among the airlock 106 and the various systems around the periphery of the first vacuum chamber 110 and through slit valves in a continuous vacuum. The second wafer handling system 116 is capable of moving wafers, such as a wafer 136, around the second vacuum chamber 112, while maintaining the wafers in a continuous vacuum. The integrated EUV mask production system 100 may operate with a reticle processing system described below. The workpiece aligner apparatus 50 can be utilized adjacent or near the carrier handling system 102.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A workpiece aligner apparatus comprising:
an aligner chuck including a rotatable arm having a first end and a second end extending in an X-Y plane;
a first edge gripping element on the first end and a second edge gripping element on the second end, the first edge gripping element and the second edge gripping element spaced apart to hold a workpiece with an opening therein at edges thereof during an alignment procedure; and
a central workpiece handling element located in a central region of the rotatable arm, wherein the central workpiece handling element has a height in a Z-direction such that the central workpiece handling element extends higher than the first edge gripping element and second edge gripping element in the Z-direction and is configured to hold a solid workpiece without an opening therein during an alignment procedure so that the solid workpiece does not contact the first edge gripping element and the second edge gripping element during the alignment procedure.

2. The workpiece aligner apparatus of claim 1, wherein the apparatus does not include a separate workpiece lifting mechanism to lift the workpiece off of the rotatable arm.

3. The workpiece aligner apparatus of claim 2, wherein the first edge gripping element and the second edge gripping element are configured to hold either a flat solid workpiece or a flat workpiece having a central opening therein.

4. The workpiece aligner apparatus of claim 3, wherein the central workpiece handling element is configured to hold a flat solid workpiece but not configured to hold a flat workpiece having a central opening therein.

5. The workpiece aligner apparatus of claim 4, further comprising a controller that controls rotation of the rotatable arm.

6. The workpiece aligner apparatus of claim 5, wherein the controller is configured to rotate the rotatable arm to a first position in which a robot blade can load the workpiece to be held by the first edge gripping element and the second edge gripping element.

7. The workpiece aligner apparatus of claim 6, wherein the controller is configured to prevent the robot blade from loading workpiece when the first edge gripping element and the second edge gripping element are in a second position which would interfere with the robot blade.

8. The workpiece aligner apparatus of claim 7, further comprising a memory to store the first position and the second position.

9. A workpiece aligner apparatus comprising:
an aligner chuck including a rotatable arm having a first end and a second end opposite the first end extending in an X-Y plane;
a first edge gripping element on the first end and a second edge gripping element on the second end, the first edge gripping element and the second edge gripping element spaced apart to hold a workpiece with an opening therein at edges of the workpiece during an alignment procedure;
a central workpiece handling element located in a central region of the rotatable arm, wherein the central workpiece handling element has a height in a Z-direction such that the central workpiece handling element extends higher than the first edge gripping element and second edge gripping element in the Z-direction, and is configured to hold a solid workpiece without an opening therein during an alignment procedure so that the solid workpiece does not contact the first edge gripping element and the second edge gripping element during the alignment procedure; and
a controller which controls rotation of the rotatable arm between a dead zone in which a robot blade is prevented from loading the workpiece to be held by the first edge gripping element and the second edge gripping element when the rotatable arm is in a first position and a transfer zone in which the robot blade is permitted to load the workpiece to be held by the first edge gripping element and the second edge gripping element when the rotatable arm is in a second position.

10. The workpiece aligner apparatus of claim 9, further comprising a memory to store the first position and the second position.

11. The workpiece aligner apparatus of claim 10, wherein the first position includes a first range of radial positions in which the robot blade does not interfere with the first edge gripping element or the second edge gripping element.

12. The workpiece aligner apparatus of claim 11, wherein the second position includes a second range of radial positions in which the robot blade interferes with the first edge gripping element or the second edge gripping element.

13. The workpiece aligner apparatus of claim 12, further comprising a memory which stores the first position and the second position.

14. A method of processing a workpiece in an aligner apparatus, the method comprising:
moving a workpiece on a robot blade and moving the robot blade toward an aligner chuck including a rotatable arm having a first end and a second end opposite the first end, a first edge gripping element on the first end and a second edge gripping element on the second end, the first edge gripping element and the second edge gripping element extending in an X-Y plane and spaced apart to hold the workpiece at edges thereof, a central workpiece handling element having a height in a Z-direction such that the central workpiece handling element extends higher that the first edge gripping element and the second edge gripping element in the Z-direction and is configured to hold a solid workpiece without an opening therein during an alignment procedure so that the solid workpiece does not contact the first edge gripping element and the second edge gripping element during the alignment procedure, the rotatable arm moveable from a first radial position which permits loading of the workpiece on the aligner chuck to a second radial position which does not permit loading of the workpiece on the aligner chuck;
checking if the rotatable arm is in the first radial position or the second radial position; and
loading the workpiece on the aligner chuck when the rotatable arm is in the first radial position.

15. The method according to claim 14, further comprising rotating the rotatable arm after loading the workpiece on the aligner chuck to align the workpiece.

16. The method according to claim 14, wherein when the rotatable arm is in the second radial position, the method further comprises preventing the robot blade from loading the workpiece on the aligner chuck.

17. The method according to claim 14, further comprising: rotating the rotatable arm until the rotatable arm is in the first radial position, and then loading the workpiece on the aligner chuck when the rotatable arm is in the first radial position.

18. The method according to claim 17, further comprising aligning the workpiece.

19. The method according to claim 18, wherein the workpiece is an EUV reticle blank on a carrier.

* * * * *